US012243581B1

(12) United States Patent
Pilo

(10) Patent No.: US 12,243,581 B1
(45) Date of Patent: Mar. 4, 2025

(54) OUTPUT DRIVER LEVEL-SHIFTING LATCH CIRCUIT FOR DUAL-RAIL MEMORY

(71) Applicant: Synopsys, Inc., Mountain View, CA (US)

(72) Inventor: Harold Pilo, Underhill, VT (US)

(73) Assignee: Synopsys, Inc., Sunnyvale, CA (US)

( * ) Notice: Subject to any disclaimer, the term of this patent is extended or adjusted under 35 U.S.C. 154(b) by 219 days.

(21) Appl. No.: 18/110,789

(22) Filed: Feb. 16, 2023

(51) Int. Cl.
*G11C 11/4091* (2006.01)
*G11C 7/06* (2006.01)
*G11C 7/10* (2006.01)
*G11C 11/4094* (2006.01)

(52) U.S. Cl.
CPC .......... *G11C 11/4091* (2013.01); *G11C 7/065* (2013.01); *G11C 7/1057* (2013.01); *G11C 11/4094* (2013.01)

(58) Field of Classification Search
CPC ... G11C 11/4091; G11C 7/065; G11C 7/1057; G11C 11/4094
USPC .......................................................... 365/207
See application file for complete search history.

(56) References Cited

U.S. PATENT DOCUMENTS

| 2013/0128655 | A1 | 5/2013 | Cheng et al. |
| 2013/0163357 | A1* | 6/2013 | Buer ................. G11C 8/08 365/201 |
| 2015/0206578 | A1 | 7/2015 | Goel et al. |
| 2017/0110164 | A1 | 4/2017 | Cheng et al. |
| 2022/0319557 | A1* | 10/2022 | Jain ................. G11C 5/147 |

* cited by examiner

*Primary Examiner* — Huan Hoang
*Assistant Examiner* — Daniel J King
(74) *Attorney, Agent, or Firm* — Andrew L. Dunlap; Haynes Beffel & Wolfeld LLP

(57) ABSTRACT

A system and method are provided for driving a dual-rail memory circuit that operates with sensing of a memory bit cell, inversion of the sense signal and level shifting in four stage delays. The system includes inversion circuitry configured to (i) receive power from a first power rail (VDDA) of the dual-rail memory, (ii) receive an output of a sense amplifier that senses a state of a bit cell of the dual-rail memory, and (iii) provide two outputs (QB, QT) limited to the first power rail VDDA. The system further includes level-shifting circuitry configured to (i) receive the two outputs of the inversion circuitry (QB, QT). (ii) receive power from a second power rail of the dual-rail memory (VDDP) and (iii) drive an output (Q) in dependence on the two outputs of the inversion circuitry (QB, QT) and limited to the second power rail VDDP which is less than the first power rail VDDA.

20 Claims, 6 Drawing Sheets

OUTPUT DRIVER LEVEL-SHIFTING LATCH CIRCUIT FOR DUAL-RAIL MEMORY

TECHNICAL FIELD

The present disclosure generally relates to a dual power supply memory in an integrated circuit that provides two voltage rail levels (e.g., two power rails). More particularly, the present invention relates to an output driver circuit for dual-rail memory.

BACKGROUND

In dual-rail (or dual power supply) memory designs, the memory interface and bitcells operate at the system on a chip (SoC) at a high power supply level (VDDA) while the remaining circuitry on the SoC operate at a lower voltage level (VDDP). Dual-rail memory designs enable SoC voltage scaling between the two power supply voltage rails to enable the higher voltage requirements for the SRAM bitcells in the memory.

SUMMARY

Embodiments provide a system and method for driving a dual-rail memory circuit that operates with sensing of a memory bit cell, inversion of the sense signal and finally level shifting in a four logic stage process. The four stages match the four stages used in a single rail sensing system and can reduce the clock delay of a dual-rail system from six logic delays to four to match the single rail sensing system.

The system embodiments include inversion circuitry configured to (i) receive power from a first power rail (VDDA) of the dual-rail memory, (ii) receive an output of a sense amplifier that senses a state of a bit cell of the dual-rail memory, and (iii) provide two outputs (QB, QT) limited to the first power rail VDDA. The system further includes level-shifting circuitry configured to (i) receive the two outputs (QB, QT) of the inversion circuitry (ii) receive power from a second power rail of the dual-rail memory (VDDP) and (iii) drive an output (Q) in dependence on the two outputs (QB, QT) of the inversion circuitry and limited to the second power rail VDDP which is less than the first power rail VDDA.

In the system, the level-shifting circuitry includes parallel stacked pull-up transistors connected in a latch configuration, the stacked transistors made up of upper and lower PMOS transistors. The upper PMOS transistors are (i) connected to the second power rail VDDP and (ii) controlled by a respective one of the latch connected cross connections (LQ, LQB) with a first one of the cross connections LQB driving the output of the level-shifting circuitry. The lower PMOS transistors are controlled by both a first output and a second output of the two outputs (QB, QT) of the inversion circuitry. The lower PMOS transistor circuitry provides a signal that drives a respective one of the latch configuration cross connections (LQ, LQB) with a first one of the cross connections LQB driving the output of the level-shifting circuitry.

The level-shifting circuitry also includes NMOS pull-down transistors. First parallel NMOS transistors connect the lower stacked PMOS transistors to a voltage source supply (VSS). The parallel NMOS transistors have gates connected to respective ones of the two outputs of the inversion circuitry (QB, QT). A second set of parallel NMOS transistors are connected in a latch configuration and connect the lower transistor circuitry to the voltage source supply VSS. This second set of parallel NMOS transistors are driven by a respective one of the latch configuration cross connections (LQ, LQB).

The level-shifting latch circuit has an output Q driven by stacked PMOS transistors along with two NMOS pull-down transistors. The stacked PMOS transistors connect the second power rail VDDP to the output Q of the level-shifting circuitry. A gate of the upper transistor of the stacked PMOS transistor output circuitry is controlled by the first output of the two outputs of the inversion circuitry (QT). A gate of the lower transistor of the stacked PMOS transistor output circuitry is controlled by the first cross connection (LQB) of the latch configured cross connections. A driver NMOS pull-down transistor connects the output Q of the level-shifting circuit to a voltage source supply VSS, with a gate controlled by one of the two outputs of the inversion circuitry QT. A hold NMOS transistor connects the output Q of the level-shifting circuit to the VSS, with a gate controlled by the first cross connection LQB of the latch configured cross connections.

The method for providing an output for a dual-rail memory includes first sensing a state of a memory cell and providing the state as two complementary outputs (QT, QB) as limited by voltage of a first power rail of the dual-rail memory VDDA. The method also includes shifting the two complementary output states from sensing (QT, QB), as limited by the voltage of the first power rail, to a voltage of a second power rail of the dual-rail memory VDDP to provide a level shifted output Q and latch the complementary signals (QT, QB).

The method controls transition of the sensing circuit output Q depending on the input state QT to allow for level-shifting from VDDA to VDDP. To do so, the method drives the level shifted output Q to 1, in dependence upon a transition of a first of the complementary output states QT to 1 while bypassing a level-shifting and holding delay. The state of Q at 1 is maintained by the hold circuitry after the QT pulse returns to 0. The method then drives the level shifted output Q to 0 in response to when the second of the two complementary output states QB pulses to 1 and a level-shifting and hold delay keeps the level shifted output Q at a 1 after QB transitions back to 0.

In the method with the output Q transitioning to 1 in a read one operation, the pull-up path to the second power rail VDDP is broken during level-shifting when pull-down occurs to transition the first complementary output QT back to 0 after pulsing to 1 in the read one operation after the level shifted output Q transitions to 1. To accomplish this, the method holds the level shifted output Q after the level-shifting delay so that the level shifted output Q will be 1 after the sensing state QT turns to a 0 in the read one operation. In the read one operation, the level-shifting delay is two logic stages. In the read zero operation when the second complementary output QB pulses to 1 causing the level shifted output Q to transition to 0, the transition is immediate.

Thus, overall the sense amplifier and inverter which produce the signals QT and QB use two logic stages. The level-shifting latch uses an additional two stages to provide the output Q. The complete circuit operates over four logic stages.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to an output driver level-shifting latch circuit for dual-rail memory.

Embodiments described herein enable a Q output level-shifting circuit with integrated latch function for dual-rail design that operates over two logic stages as a two stage system. The integrated level-shifting and latch design uses parallel output driver and hold transistor paths to bypass a serial level-shifting delay associated with dual-rail memories. This solution overall provides a four-stage delay from sense amplifier enable (SAE) to output Q, which is equal to that of single-rail designs.

Dual-rail memory systems introduce additional stage delays relative to a single-rail memory system that uses four stages. To have all memories in a SoC functioning the same, it is desirable to reduce the stage delays of the dual-rail system to match the single-rail system in all memories provided on a SoC.

Embodiments herein describe a dual-rail memory system that has four stages like a single-rail memory. To accomplish providing a four-stage system the dual-rail memory system described herein introduces a level-shifter and hold circuit to transition between the higher VDDA power rail of the memory system to the lower VDDP power rail used for the remaining circuit. The bit-cell read sense amplifier used in the dual-rail memory can substantially the same as a sense amplifier of a single rail system. However, an inverter circuit connects the sense amplifier to provide complementary outputs QT and QB that pulsed and provided to the level shifter and hold circuit to enable the level shifter and hold circuit to function to provide the system output Q based on the complementary signals QT and QB in only two additional stages.

Advantages of the level shifter and hold circuitry enable the dual-rail memory system to operate at the four-stage delay of a single-rail memory. Internal components of the level shifter and hold circuit include latches to hold the state of the complementary signals QT and QB after one of them pulses to change the state of the output Q, as well as to hold the state of Q. Pull-up and pull-down transistors function to transition the voltage levels from VDDA to VDDP quickly without suffering a level shifting and hold delay that might cause the system to provide a delay of more than 4 stages.

Figure 1:
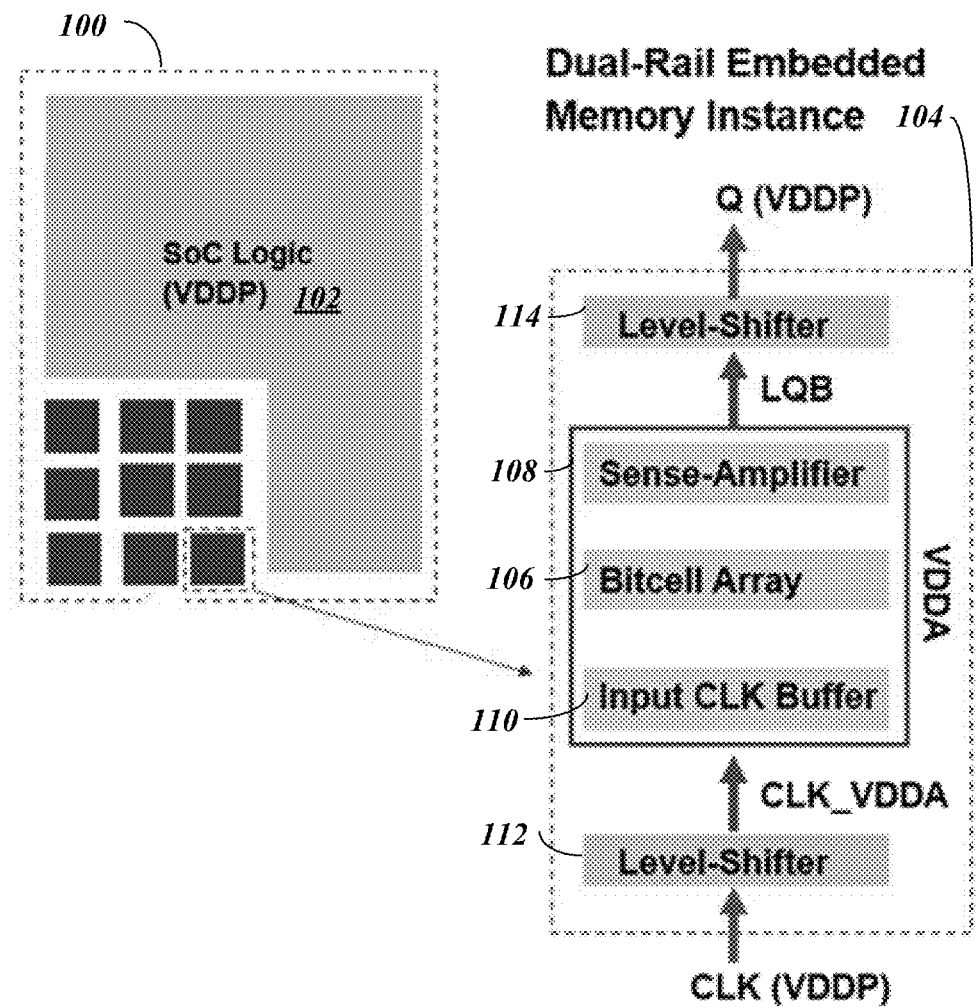
FIG. 1 is a block diagram of components making up a dual-rail memory instance in a System on a Chip (SoC).

FIG. 1 shows a block diagram of components making up a dual-rail memory instance in a System on a Chip (SoC). The SoC 100 shown includes logic 102 operating at a voltage rail VDDP. The SoC also includes a dual-rail memory 104 which operates at a higher voltage rail VDDA to enable writing to the dual-rail memory 104. In one example, the VDDP voltage is 0.4 Volts while VDDA is 1.2 Volts. The memory 104 is therefore a dual-rail memory with instance circuitry that transitions from the higher VDDA voltage of the memory to a lower voltage VDDP of the logic circuitry 102 when providing the memory state to the logic circuitry 102. The dual-rail memory 104 also translates voltages from other circuitry of the SoC 100, such as the clock which operates at the lower VDDP voltage, to the higher VDDA voltage of the memory 104. A level shifter 112 provides a circuit to convert the system clock of the SoC which operates at VDDP to a clock signal that operates at the higher voltage VDDA of the memory circuitry.

The dual-rail memory 104 shown in FIG. 1, therefore includes first circuitry operating at a voltage VDDA including the memory bit cells 106 (bitcell array) and sense amplifiers 108 that detect the state of the bit cells 106. Further circuitry operating at VDDA includes the input clock buffer 110 (input CLK buffer) that clocks operations to read and write from the bit cells 106 and to operate the sense amplifiers 108.

The dual-rail memory 104 also includes circuitry to translate between the voltage VDDP of the SoC 100 and the higher VDDA voltage of memory 104. First, the level-shifter 112 includes circuitry to translate the clock of the SoC 100 operating at VDDP to the higher VDDA voltage of memory 104. Further, another level-shifter circuit 114 (level-shifter) is included in the memory 104 to translate the sense amplifiers 108 which operate at VDDA to the lower voltage VDDP of the logic 102 on the SoC 100. Embodiments described herein provide circuitry for such a sense amplifier with a goal to reduce stage delays of dual-rail systems so that all memory systems in a SoC operate with a common number of stages.

Figure 2:
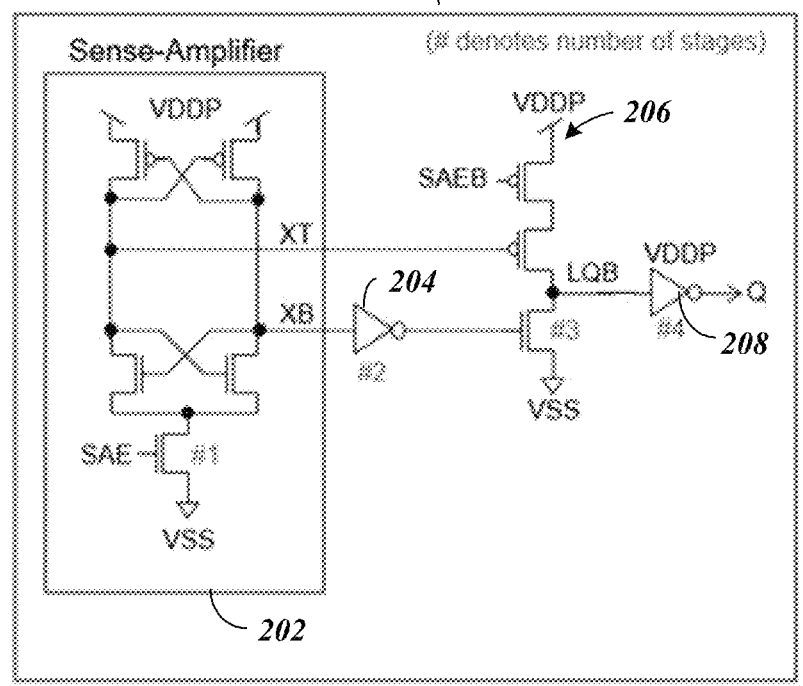
FIG. 2 shows circuitry for a single rail memory design with four stages.

FIG. 2 shows circuitry for a single-rail memory design 200 that includes four stages. The single-rail system of FIG. 2 is shown and described to illustrate that a single-rail system operates with four stages, and includes some components that are carried over to similar circuit components in a dual-rail system. The goal of embodiments of a dual-rail system described herein is to provide similar stage delays in all memories of a SoC, so it is desirable to maintain four stages in dual-rail memory systems to match the single-rail four stage delay. The single rail design shown in FIG. 2 operates with both the memory and other components of the circuit all operating at a lower voltage VDDP. FIG. 2 provides a reference to show a desired number of stages that are used to sense the state of a bit cell and provide the output to components of a SoC. The symbol #followed by a number denotes the separate stages of the single rail design 200.

In FIG. 2, the first stage is a sense amplifier 202. The sense amplifier includes two PMOS pull-up transistors connected in a latch configuration to the rail voltage VDDP and two NMOS pull-down transistors connecting to the system supply (VSS) also connected in a latch configuration. The connection to VSS is through an enabling transistor connected to the sense amplifier enable (SAE) signal.

A second stage in FIG. 2 is provided by inverter 204. The inverter 204 receives the sense amplifier output (XB). Inverter 204 has power provided from the VDDP rail voltage.

A third stage in FIG. 2 is another logic stage 206. The logic stage 206 includes two stacked PMOS transistors for connecting to the rail voltage VDDP. The upper PMOS transistor has a gate controlled by the inverse of the SAE signal, which is SAEB. The lower PMOS transistor has a gate controlled by the output (XT) of the sense amplifier 202. The third stage also includes an NMOS pull-down transistor connected to VSS and a gate input driven by the output of the stage two inverter 204.

A fourth stage in FIG. 2 is another inverter 208 that has power provided from the VDDP voltage rail. The output of the fourth stage is the overall output (Q) of the system. The four stages provided in FIG. 2 are provided in a single rail design.

Figure 3:
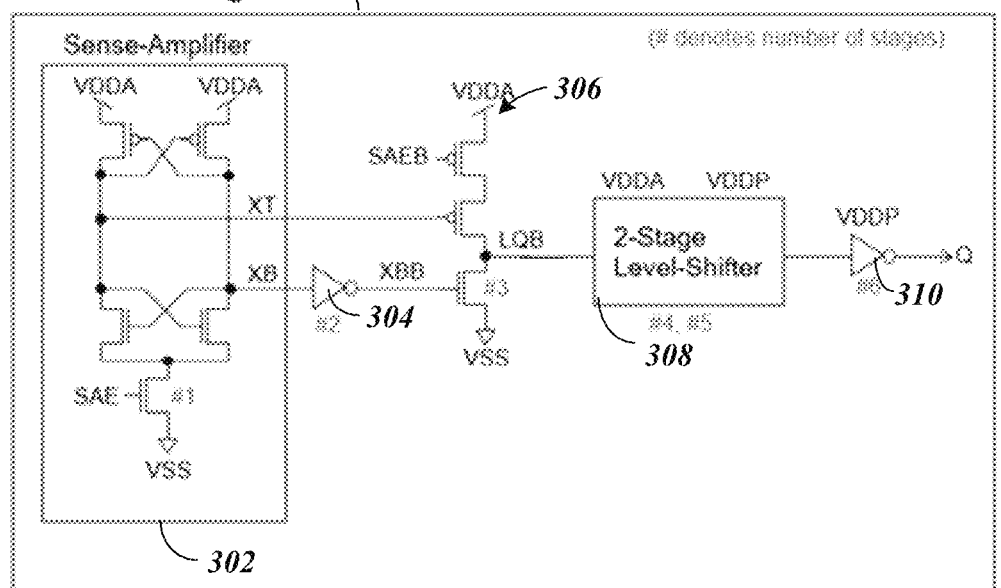
FIG. 3 shows circuitry for a dual-rail memory design with six stages.

FIG. 3 shows circuitry for a dual-rail memory design that uses six stages, or two additional stages relative to the single rail design of FIG. 2. Specifically, FIG. 3 includes the dual-rail memory 300 that includes a first stage having the sense amplifier 302 that includes similar circuitry to the sense amplifier 202 of the single rail design. The second stage 304 is an inverter buffer similar to the inverter 204 of the single rail design. The third stage is another logic stage 306 similar to the second logic stage 206 of the single rail design of FIG. 2, except the logic stage 306 of dual-rail design connects to the higher voltage rail VDDA of the memory instead of the lower rail VDDP used in a single rail design of FIG. 2. The dual-rail design of FIG. 3 next introduces a level-shifter 308 for shifting from the higher voltage rail VDDA of the memory to a lower voltage VDDA for other SoC circuitry separate from the memory. The level shifter 308 that provides two stages of latency or delay. The dual-rail circuit of FIG. 3 next includes an inverter 310 in stage 6, which is similar to single rail inverter 308 of FIG. 2.

The dual-rail high speed register of FIG. 3 requires an additional 2-stage delays of the level shifter 308 relative to the four stage delay of the single-rail system of FIG. 2 to change the LQB output signal at the output of the inverter 306 operating at the VDDA power rail to provide an input to the final inverter 310 which operates at the VDDP power rail. It is noted that the total number of logic stages from SAE to Q changes from 4 to 6. Further the full clock to Q path increases from 10 stage delays to 12 stage delays in the dual-rail design due to the number of stages of system that require proper operation. A problem with the dual-rail design of FIG. 3 is these added stages which do not match with a single-rail system like that shown in FIG. 2.

Figure 4:
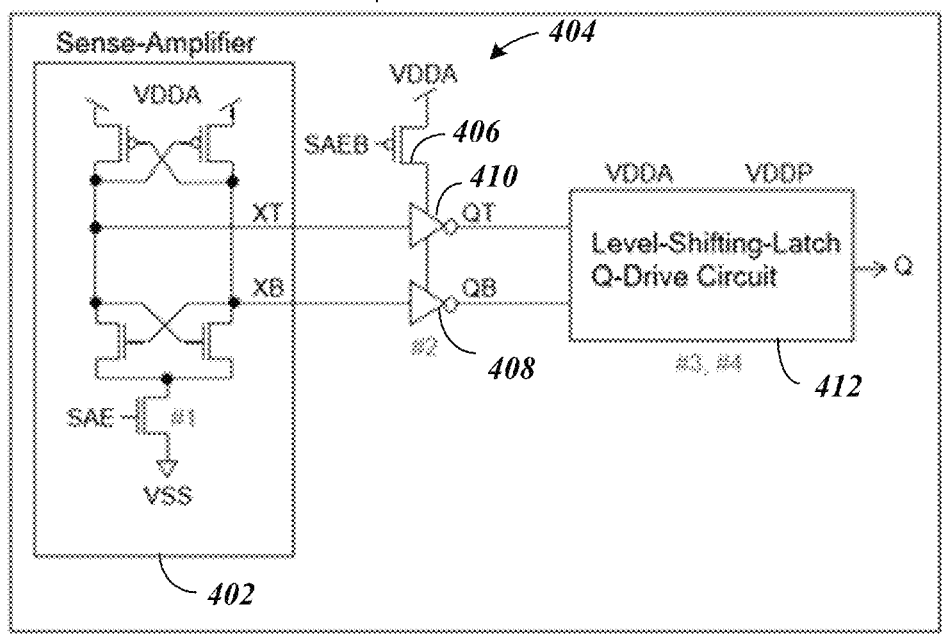
FIG. 4 shows circuitry for an improved dual-rail memory design with four stages, including a level-shifting latch.

FIG. 4 shows circuitry 400 for an improved dual-rail memory design with four stages according to embodiments. The first stage of the dual-rail circuitry 400 of FIG. 4 includes a sense amplifier 402. The circuitry of the sense amplifier is similar to the dual-rail sense amplifier 302 of FIG. 3 and operates at the higher rail voltage VDDA associated with a memory bit cell.

Outputs of the sense amplifier 402, XT and the inverse XB, are provided to a second stage inversion circuit 404 that has circuitry that is different than the dual-rail memory design of FIG. 3. The inversion circuit 404 includes a PMOS transistor 406 connecting to the higher VDDA power rail with control received from the sense amplifier enable SAE. The PMOS transistor 406 provides power to two inverters 408 and 410 that (i) receive the outputs XB and XT from the sense amplifier 402 and (ii) provide outputs QB and QT.

The final two stages of FIG. 4 are provided by the level-shifting latch circuit 412. The level-shifting latch 412 converts from the higher memory VDDA power rail to the VDDP power rail. The level-shifting latch 412 receives the inputs QB and QT from the inversion circuit 404 and provides an output Q from the dual-rail circuit 400.

Figure 5:
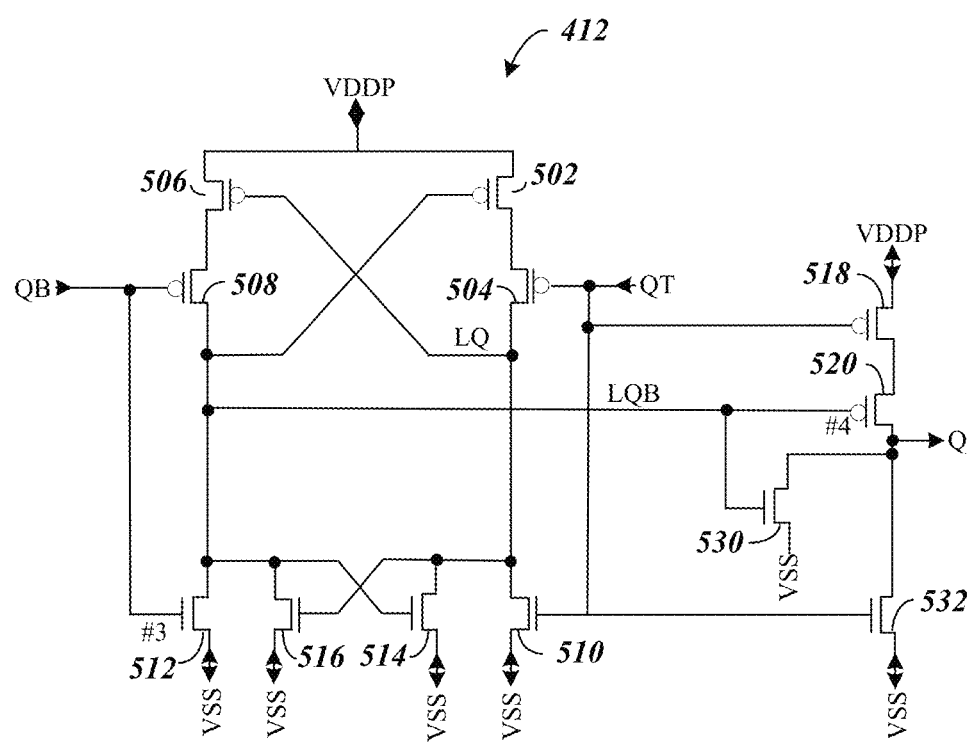
FIG. 5 shows circuitry for the level-shifting latch of FIG. 4.

FIG. 5 shows specific circuitry for the level-shifting latch 412 of FIG. 4. The circuit first includes parallel connected stacked PMOS pull-up transistors 502, 504 and 506, 508. The upper PMOS pull-up transistors 502 and 506 connect the lower VDDP voltage rail to the top end of lower PMOS pull-up transistors 504 and 508 and have gates connected in a latch configuration to respective ones of the bottom of lower PMOS pull-up transistors 504 and 508. The gate of lower PMOS pull-up transistor 504 receives the QT output from the inverter circuit 404 operating at the voltage rail VDDA. The gate of lower PMOS pull-up transistor 508 receives the QB output from the inverter circuit 404.

The circuit of FIG. 5 further includes parallel NMOS pull-down transistors 510 and 512 that connect to LQ and LQB, respectively. Gates of the parallel NMOS pull-down transistors 510 and 512 are connected to the respective outputs QT and QB of the inverter circuit 404.

A combination of the stacked PMOS transistors 502, 504 and 506, 508 along with the NMOS pull-down transistors 510 and 512 functionally form a level shifter circuit. QT and QB which drive the level shifter circuit are pulsed signals that have voltages at the VDDA level. Because QT and QB are pulsed, a latch circuitry is implemented to hold the outputs LQ and LQB signal state of the level shifter circuit after the QT and QB signals are pulsed so that the output Q will maintain the same state after the QT and QB signal returns to 0 after pulsing. The output LQ is provided at the junction of lower PMOS transistor 508 and NMOS transistor 512. The output LQB is provided at the junction of lower PMOS transistor 504 and NMOS transistor 510.

The NMOS pull-down transistors 514 and 516 form the latch to hold the state of LQB and LQ after QT and QB are pulsed. The NMOS pull-down transistors 514 and 516 have gates cross connected in a latch configuration. The NMOS pull-down transistor 514 connects LQ to VSS and NMOS transistor 516 connects LQB to VSS.

The output Q of the level-shifting latch 406 is driven by stacked PMOS pull-up transistors 518 and 520, NMOS driver 532 and NMOS hold transistor 530. The upper PMOS pull-up transistor 518 connects VDDP to the output Q through lower PMOS transistor 520, and the upper PMOS transistor 518 and has a gate driven by QT. The lower PMOS transistor has a gate driven by LQB. The NMOS hold transistor 530 connects the output Q to VSS and has a gate driven by LQB. The NMOS driver transistor 532 connects the output Q to VSS and has a gate connected to QT.

In operation, first a read one operation is considered when QB pulses high to a 1 to transition Q to 1. Initially after QB pulses to a 1, LQB is driven low and Q then transitions to 1. LQ transitions to VDDP to break feedback from the LQB output. LQB is kept at 0 when QB returns to 0 after pulsing as latched by the NMOS latch connected transistors 514 and 516. In summary for the read one operation, QB rises to a 1 which forces LQB low, and this in turn drives Q to 1.

In operation with a read zero operation QT pulses high to a 1, the level shifter circuit delay is bypassed, and the output Q is transitioned to 0. First, with QT pulsing high, the NMOS driver transistor 532 forces Q to 0. The upper PMOS pull-up transistor 518 with an input of QT breaks the path to VDDP to allow the NMOS driver transistor to pull Q to 0. LQB transitions to VDDP after two gate delays to enable hold transistor 530 to keep Q at 0. After QT pulsing is complete, QT returns to 0, but Q is held at 0 by NMOS hold transistor 532.

In summary for the read zero operation, the QT rising edge forces Q to 0 and level-shifter delay is bypassed. LQB rises after level-shifter delay to hold a 0 value on Q before the QT pulse resets.

Experimental timing results were performed using the dual-rail memory system of FIG. 3 and the dual-rail memory system of FIGS. 4-5. In the design of FIG. 3 the transition of the output Q to 0 after the SAE signal took 33.8 ps, while the transition of Q to 1 took 26.3 ps. In the design of FIGS. 4-5 the transition of the output Q to 0 after the SAE signal took 24.2 ps, while the transition of Q to 1 took 24.4 ps. Thus, the system of FIGS. 4-5 shows a significant time reduction.

Figure 6:
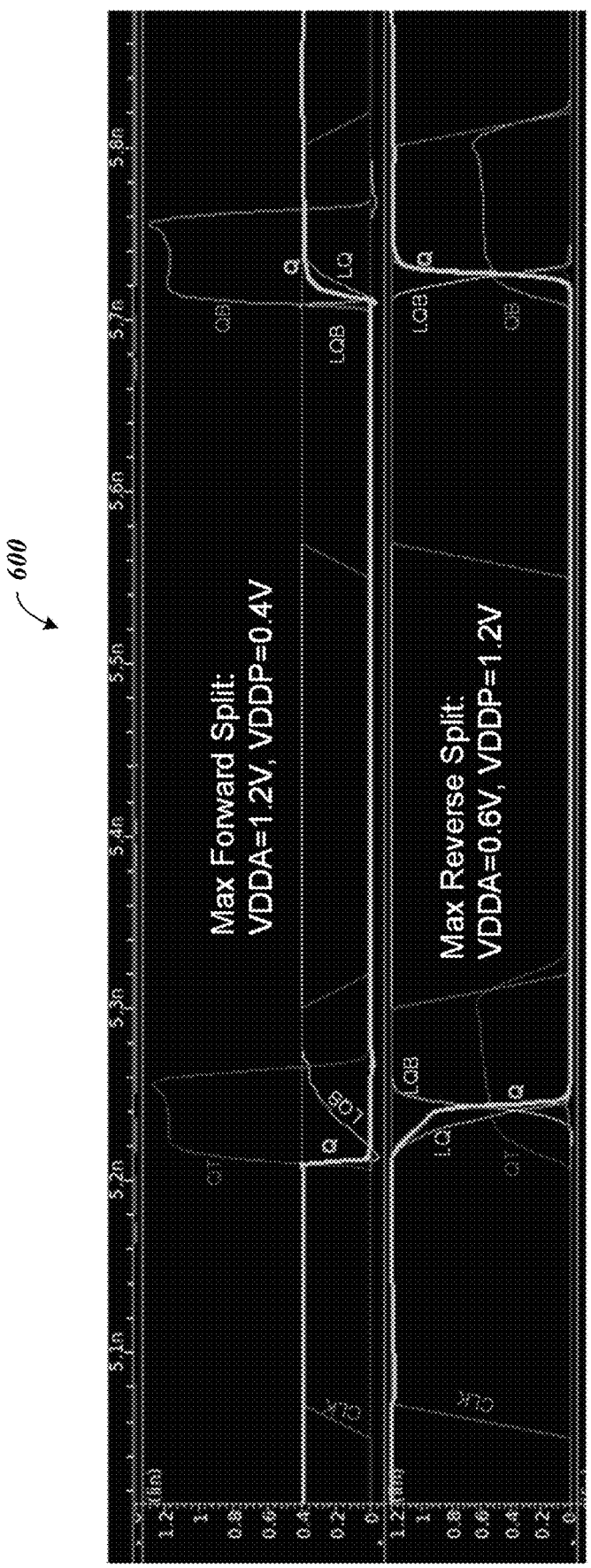
FIG. 6 provides a graph showing the results using the circuit of FIGS. 4-5 when the VDDP and VDDA voltages are reversed.

FIG. 6 provides a graph 600 showing the results using the circuit of FIGS. 4-5 when the VDDP and VDDA voltages are reversed and VDDA is now the low voltage. The top waveform diagram shows functionality for a maximum forward split in a normal configuration with VDDA being the higher voltage. The bottom diagram shows functionality for a maximum reverse split with VDDP now being the higher voltage. The graph of FIG. 6 shows the resiliency of the system should be voltages VDDP and VDDA operate in a reverse split configuration, as the circuit components will still function without damage to the system.

Circuitry described in portions of the preceding detailed descriptions is controlled in some embodiments by processors which operate in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An output driver for a dual-rail memory comprising:
   inversion circuitry configured to (i) receive voltage (VDDA) from a first power rail of the dual-rail memory, (ii) receive an output of a sense amplifier that senses a state of a bit cell of the dual-rail memory, and (iii) provide two outputs (QB, QT) having a voltage not greater than a voltage level of the first power rail; and
   level-shifting circuitry configured to (i) receive the two outputs (QB, QT) of the inversion circuitry (ii) receive voltage (VDDP) from a second power rail of the dual-rail memory and (iii) drive an output (Q) based on the two outputs (QB, QT) of the inversion circuitry, the output (Q) having a voltage not greater than a voltage level of the second power rail, which is less than the voltage level of the first power rail.

2. The output driver of claim 1,
   wherein the level-shifting circuitry comprises parallel stacked pull-up transistors connected in a latch configuration, the stacked pull-up transistors being made up of upper and lower PMOS transistors with upper transistor circuitry stacked above lower transistor circuitry, and
   wherein the upper PMOS transistors are (i) connected to the second power rail and (ii) controlled by a respective latch configuration cross connection of latch configuration cross connections (LQ, LQB) with a first latch configuration cross connection (LQB) driving an output of the level-shifting circuitry.

3. The output driver of claim 2,
   wherein the lower PMOS transistors are controlled by both a first output and a second output of the two outputs (QB, QT) of the inversion circuitry, and
   wherein the lower PMOS transistors provide a signal that drives the respective latch configuration cross connections (LQ, LQB) with the first latch configuration cross connection (LQB) driving the output of the level-shifting circuitry.

4. The output driver of claim 3, wherein the level-shifting circuitry further comprises a first set of parallel NMOS pull-down transistors having gates connected to respective ones of the two outputs (QB, QT) of the inversion circuitry.

5. The output driver of claim 3, wherein the level-shifting circuitry further comprises:
a second set of parallel NMOS transistors connected in a latch configuration, wherein the second set of parallel NMOS transistors connect the lower PMOS transistors to a voltage source supply (VSS), wherein the second set of parallel NMOS transistors are driven by the respective latch configuration cross connections (LQ, LQB).

6. The output driver of claim 3, wherein the level-shifting circuitry further comprises:
stacked PMOS transistor output circuitry connecting the second power rail to the output (Q) of the level-shifting circuitry,
wherein a gate of an upper transistor of the stacked PMOS transistor output circuitry is controlled by the first output (QT) of the two outputs (QB, QT) of the inversion circuitry, and
wherein a gate of a lower transistor of the stacked PMOS transistor output circuitry is controlled by the first latch configuration cross connection (LQB) of the latch configuration cross connections (LQ, LQB).

7. The output driver of claim 6, further comprising dual pull-down NMOS transistors comprising:
a driver NMOS pull-down transistor connecting the output (Q) of the level-shifting circuitry to a voltage source supply (VSS), with a gate controlled by the first output (QT) of the two outputs (QB, QT) of the inversion circuitry; and
a hold NMOS transistor connecting the output (Q) of the level-shifting circuitry to the VSS, with a gate controlled by the first latch configuration cross connection (LQB) of the latch configuration cross connections (LQ, LQB).

8. A method for providing an output of a dual-rail memory, the method comprising:
sensing a state of a memory cell and providing the state as two complementary outputs (QT, QB) having a voltage not greater than a voltage (VDDA) of a first power rail of the dual-rail memory; and
level shifting the two complementary outputs (QT, QB) to a voltage (VDDP) of a second power rail of the dual-rail memory, which is less than a voltage level of the first power rail, to provide a level shifted output (Q) and latch the two complementary outputs (QT, QB).

9. The method of claim 8, further comprising:
driving the level shifted output (Q) to 1, based on a transition of a first complementary output (QT) of the two complementary outputs (QT, QB) to 1, wherein a level shifting and hold delay keeps the level shifted output (Q) at 1 when the first complementary output (QT) transitions back to 0; and
driving the level shifted output (Q) to 0 in response to a second complementary output (QB) of the two complementary outputs (QT, QB) transitioning to 1.

10. The method of claim 9, further comprising:
breaking a pull-up path to the second power rail during level shifting when pull-down occurs of transistors driving the level shifted output (Q) in a read one operation when the level shifted output (Q) transitions to 1.

11. The method of claim 9, further comprising:
holding the level shifted output (Q) after the level shifting delay so that the level shifted output (Q) will transition to 1 and hold that state after the first complementary output (QT) turns to a 0 in a read one operation.

12. The method of claim 11, wherein in the read one operation the level shifting delay is two logic stage delays.

13. The method of claim 11, wherein, when the second complementary output (QB) turns to 1 in a read zero operation causing the level shifted output (Q) to transition to 0, a delay is less than two stage delays.

14. The method of claim 8, wherein the sensing of the state of the memory cell and the providing of the state uses two logic stage delays and the level shifting uses two logic stage delays.

15. The method of claim 8, wherein a total number of stage delays from the sensing of the state of the memory cell, the providing of the state and the providing of the level shifted output (Q) is four stage delays.

16. A non-transitory computer readable medium comprising stored instructions for providing an output of a dual-rail memory, the instructions, when executed by a processor, cause the processor to control circuitry to:
sense a state of a memory cell and provide the state as two complementary outputs (QT, QB) having a voltage not greater than a voltage (VDDA) of a first power rail of the dual-rail memory; and
level shift the two complementary outputs (QT, QB), as limited by the voltage of the first power rail, to a voltage (VDDP) of a second power rail of the dual-rail memory, which is less than a voltage level of the first power rail, to provide a level shifted output (Q) and latch the two complementary outputs (QT, QB).

17. The non-transitory computer readable medium of claim 16, wherein the instructions further cause to the processor to control circuitry to:
drive the level shifted output (Q) to 1, based on a transition of a first complementary output (QT) of the two complementary outputs (QT, QB) to 1, wherein a level shifting and hold delay keeps the level shifted output (Q) at 1 when the first complementary output (QT) transitions back to 0; and
drive the level shifted output (Q) to 0 in response to a second complementary output (QB) of the two complementary outputs (QT, QB) transitioning to 1.

18. The non-transitory computer readable medium of claim 17, wherein the instructions further cause to the processor to control circuitry to:
hold the level shifted output (Q) after the level shifting delay so that the level shifted output (Q) will transition to 1 and hold that state after the first complementary output (QT) turns to a 0 in a read one operation.

19. The non-transitory computer readable medium of claim 16, wherein the sensing of the state of the memory cell and the providing of the state uses two logic stage delays and the level shifting uses two logic stage delays.

20. The non-transitory computer readable medium of claim 16, wherein a total number of stage delays from the sensing of the state of the memory cell, the providing of the state and the providing of the level shifted output (Q) is four stage delays.

* * * * *